United States Patent
Baumgartner et al.

(10) Patent No.: US 9,483,595 B2
(45) Date of Patent: *Nov. 1, 2016

(54) METHOD FOR SCALABLE LIVENESS VERIFICATION VIA ABSTRACTION REFINEMENT

(71) Applicant: International Business Machines Corporation, Armonk, NY (US)

(72) Inventors: Jason R. Baumgartner, Austin, TX (US); Raj K. Gajavelly, Warangal (IN); Robert L. Kanzelman, Rochester, MN (US); Hari Mony, Austin, TX (US); Pradeep K. Nalla, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/729,812

(22) Filed: Jun. 3, 2015

(65) Prior Publication Data
US 2016/0210389 A1    Jul. 21, 2016

Related U.S. Application Data

(63) Continuation of application No. 14/599,827, filed on Jan. 19, 2015.

(51) Int. Cl.
*G06F 17/50*    (2006.01)

(52) U.S. Cl.
CPC ....... *G06F 17/5045* (2013.01); *G06F 17/5022* (2013.01)

(58) Field of Classification Search
CPC .................. G06F 17/5022; G06F 17/5045
USPC ................................................ 716/106–107
See application file for complete search history.

(56) References Cited

U.S. PATENT DOCUMENTS 7,406,405 B2   7/2008   McMillan et al.
7,661,082 B1*   2/2010   McMillan ............. G06F 17/504
                                                         703/13

(Continued)

OTHER PUBLICATIONS

Nalla, Pradeep, et al., "Effective Liveness Verification using a Transformation-Based Framework", 27th Int'l. Conf. on VLSI Design, pp. 74-79 (2014).

(Continued)

*Primary Examiner* — Stacy Whitmore
(74) *Attorney, Agent, or Firm* — Steven L. Bennett; Jack V. Musgrove (57) ABSTRACT

Liveness verification of a logic design is performed using various shadow abstraction refinement techniques. An initial subset of state elements are included in the shadow abstraction, and verification is performed (liveness-to-safety conversion) using this initial subset. If a liveness counterexample is detected, the shadow abstraction is refined by designating a second subset of the state elements different from the initial subset for inclusion in a refined abstraction. The initial subset can be designated by choosing all registers in a combinational fan-in of a liveness property of the design. High-performance algorithms for abstract liveness-to-safety conversion can be based upon simulation and counterexample refinement, bounded model checking and counterexample refinement, bounded model checking and proof-based refinement, proofs obtained during bounded model checking of a precise liveness checking problem, a hybrid of counterexample-based refinement and proof analysis, and proofs obtained.

7 Claims, 4 Drawing Sheets

(56) References Cited

U.S. PATENT DOCUMENTS

| | | | |
|---|---|---|---|
| 8,255,848 B2 | 8/2012 | Baumgartner et al. | |
| 8,352,894 B2 | 1/2013 | Baumgartner et al. | |
| 8,418,101 B1* | 4/2013 | Kuehlmann | G06F 17/5031 |
| | | | 716/106 |
| 8,527,922 B1 | 9/2013 | Baumgartner et al. | |
| 8,627,273 B2 | 1/2014 | Baumgartner et al. | |
| 2004/0123254 A1* | 6/2004 | Geist | G06F 17/504 |
| | | | 716/103 |
| 2005/0193304 A1* | 9/2005 | Abraham | G06F 17/504 |
| | | | 714/738 |
| 2009/0064064 A1* | 3/2009 | Eisner | G06F 17/504 |
| | | | 716/106 |
| 2010/0088678 A1* | 4/2010 | AlTurki | G06F 11/3608 |
| | | | 717/124 |

OTHER PUBLICATIONS

Biere, Armin, et al., "Liveness Checking as Safety Checking", Electronic Notes in Theoretical Computer Science (Formal Methods for Industrial Critical Systems), v. 66, n. 2, pp. 160-177 (Dec. 2002).

Schuppan, Viktor, "Liveness Checking as Safety Checking to Find Shortest Counterexamples to Linear Time Properties" (dissertation), Swiss Federal Institute of Technology Zurich (2005).

Baumgartner, Jason, et al., "Scalable Liveness Checking via Property-Preserving Transformations", Design, Automation & Test in Europe Conf., pp. 1680-1685 (Apr. 2009).

* cited by examiner

METHOD FOR SCALABLE LIVENESS VERIFICATION VIA ABSTRACTION REFINEMENT

CROSS-REFERENCE TO RELATED APPLICATION

This application is a continuation of copending U.S. patent application Ser. No. 14/599,827 filed Jan. 19, 2015.

BACKGROUND OF THE INVENTION

1. Field of the Invention

The present invention generally relates to the design of logic circuits, and more particularly to a method of verifying a logic design through liveness checking.

2. Description of the Related Art

As electronic systems such as computers grow more complex with an ever greater number of interconnected devices, it becomes increasingly important to ensure that a system (or subsystem) design is going to work properly before proceeding with fabrication preparation. A variety of techniques can be performed to evaluate a design-under-test, including simulation, proof by theorem (formal verification), and model-checking. Model checking was developed to complement simulation-based verification. During model checking, an integrated circuit (IC) design to be verified is modeled as a finite state machine, and a design specification is formalized by writing temporal logic properties. The reachable states of the design are then traversed in order to verify the properties. In case the property fails, a counterexample is generated in the form of a sequence of states leading up to the failure.

Various attributes of a design can be checked during verification. One technique is known as liveness checking. Liveness checking refers to the verification of properties of a logic design which are used to assess whether it will "eventually" behave in a correct way, i.e., something good must eventually happen. For example, if verifying an arbiter, one may wish to check the property that "every request presented to the arbiter must eventually be granted". Such properties are critical to establish in modern hardware designs given that Moore's law is now entailing complex multi-core on top of multi-execution unit systems, systems on a chip (SoC), and increasingly complicated communication fabrics. Failure to adhere to such liveness properties entails unacceptable system performances, if not system deadlock. Any counterexample to such a property must be of infinite length, i.e., showing a request which never receives a grant. This is often represented using a finite-length trace, where some suffix of that trace—denoted by the assertion of a specially added LOOP signal—starts with a particular state, and ends with the identical state about to be repeated. Semantically, this represents an infinite length counterexample since the suffix behavior where the loop is asserted may be repeated as many times as desired to witness the request-without-grant scenario.

Liveness checking is in contrast to safety checking. A safety property asserts that something bad never should happen. Liveness properties can be translated to safety properties through a known transformation which effectively doubles the state elements of that design, enabling the ability to sample the current state of the design and to later check for a repetition, thereby completing a loop (see "Liveness checking as safety checking" by Armin Biere et al., International Workshop on Formal Methods for Industrial Critical Systems, 2002).

Figure 1:
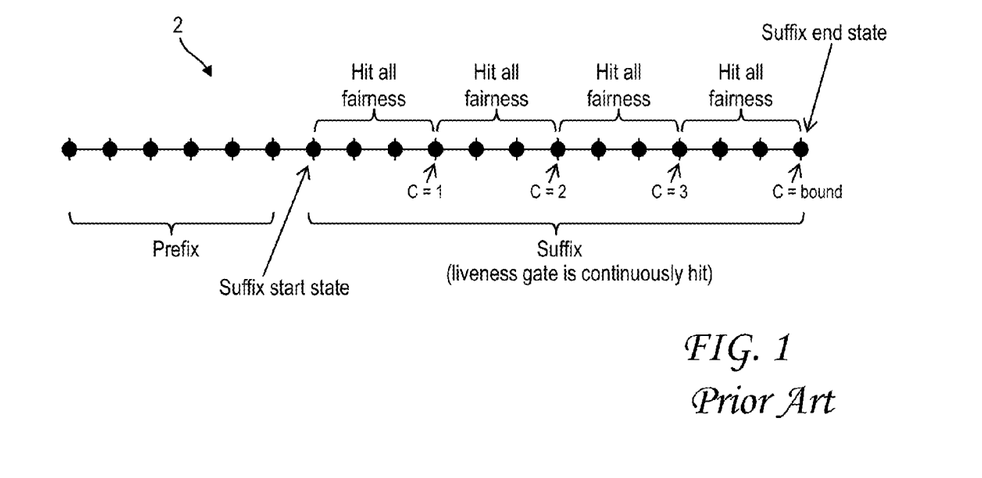
FIG. 1 is a pictorial representation of a conventional bounded liveness counterexample having a prefix and a suffix containing one or more loops.

Liveness checks often require the specification of "fairness" conditions which impose restrictions on the behavior during the loop which may be presented as a failure. For example, perhaps the arbiter under verification has a skewed priority scheme such that high priority requests always take priority over low priority requests. An infinite sequence of high-priority requests may thus starve out low-priority requests in a valid design. It thus may be required to prevent the reporting of failures where high-priority requests within the loop starve out low-priority requests. The de-assertion of high-priority requests may thus be specified as a fairness constraint. FIG. 1 depicts the behavior of bounded liveness counterexample 2. It has prefix followed by suffix, where the suffix contains all the conditions required for the bounded liveness failure. In this example the simulation sets a loop repeat bound of 4, so once the suffix end state reaches the same condition a fourth time, a failure is reported.

SUMMARY OF THE INVENTION

The present invention is generally directed to a method of verifying liveness of a logic design by receiving a circuit description for the logic design which includes vertices representing gates and edges representing interconnections between the gates, wherein portions of the gates represent different state elements which can be evaluated to determine a state of the logic design, designating an initial subset of the state elements for inclusion in an abstraction of the logic design, performing liveness verification on the abstraction based on the initial subset of the state elements, detecting a liveness counterexample in response to said performing the liveness verification, and refining the abstraction by designating a second subset of the state elements different from the initial subset for inclusion in a refined abstraction.

The above as well as additional objectives, features, and advantages of the present invention will become apparent in the following detailed written description.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 2:
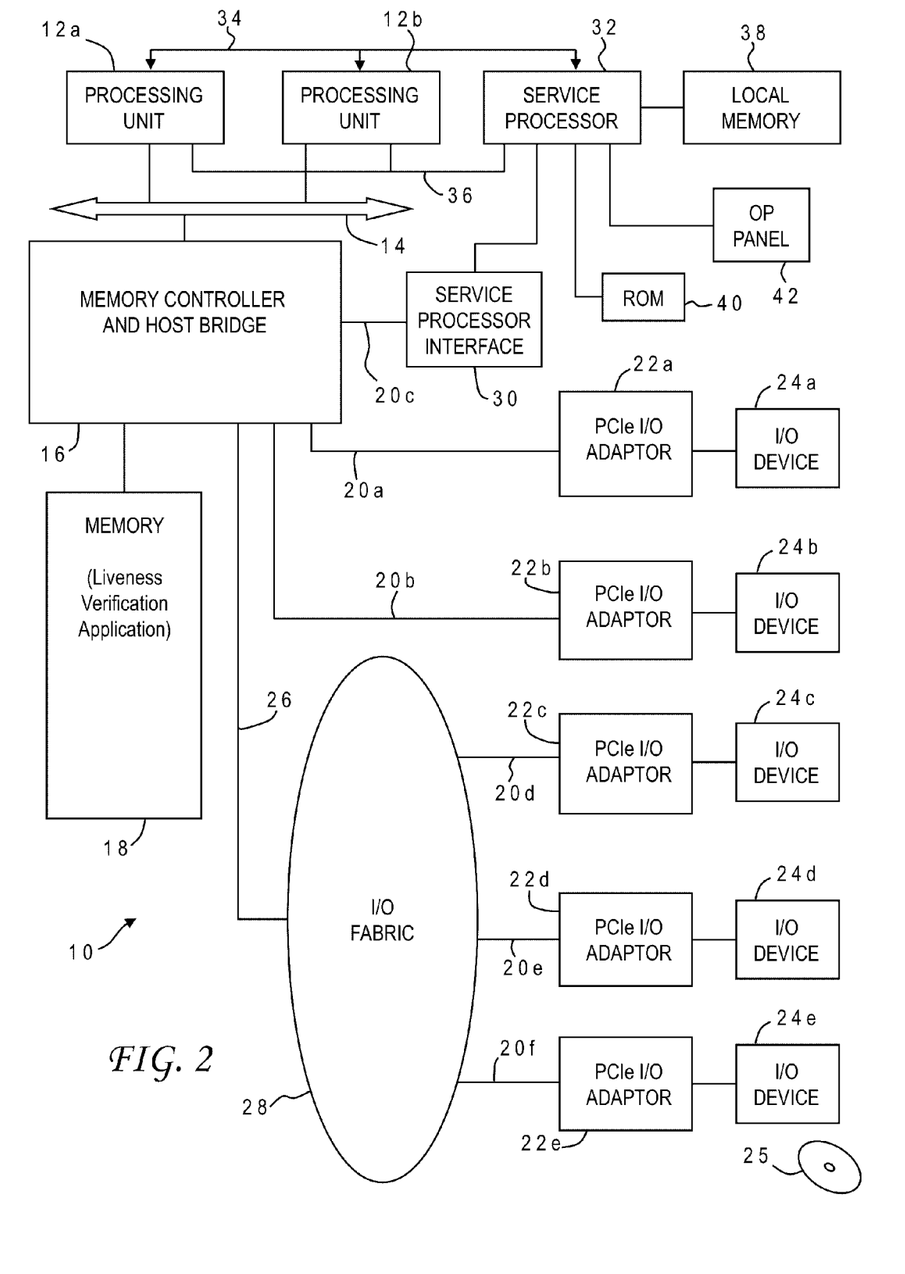
FIG. 2 is a block diagram of a computer system programmed to carry out liveness verification in accordance with one implementation of the present invention.

With reference now to the figures, and in particular with reference to FIG. 2, there is depicted one embodiment 10 of a computer system in which the present invention may be implemented to carry out the design and verification of logic structures in an integrated circuit. Computer system 10 is a symmetric multiprocessor (SMP) system having a plurality of processors 12a, 12b connected to a system bus 14. System bus 14 is further connected to and communicates with a combined memory controller/host bridge (MC/HB) 16 which provides an interface to system memory 18. System memory 18 may be a local memory device or alternatively may include a plurality of distributed memory devices, preferably dynamic random-access memory (DRAM). There may be additional structures in the memory hierarchy which are not depicted, such as on-board (L1) and second-level (L2) or third-level (L3) caches.

MC/HB 16 also has an interface to peripheral component interconnect (PCI) Express links 20a, 20b, 20c. Each PCI Express (PCIe) link 20a, 20b is connected to a respective PCIe adaptor 22a, 22b, and each PCIe adaptor 22a, 22b is connected to a respective input/output (I/O) device 24a, 24b. MC/HB 16 may additionally have an interface to an I/O bus 26 which is connected to a switch (I/O fabric) 28. Switch 28 provides a fan-out for the I/O bus to a plurality of PCI links 20d, 20e, 20f. These PCI links are connected to more PCIe adaptors 22c, 22d, 22e which in turn support more I/O devices 24c, 24d, 24e. The I/O devices may include, without limitation, a keyboard, a graphical pointing device (mouse), a microphone, a display device, speakers, a permanent storage device (hard disk drive) or an array of such storage devices, an optical disk drive which receives an optical disk 25 (one example of a computer readable storage medium) such as a CD or DVD, and a network card. Each PCIe adaptor provides an interface between the PCI link and the respective I/O device. MC/HB 16 provides a low latency path through which processors 12a, 12b may access PCI devices mapped anywhere within bus memory or I/O address spaces. MC/HB 16 further provides a high bandwidth path to allow the PCI devices to access memory 18. Switch 28 may provide peer-to-peer communications between different endpoints and this data traffic does not need to be forwarded to MC/HB 16 if it does not involve cache-coherent memory transfers. Switch 28 is shown as a separate logical component but it could be integrated into MC/HB 16.

In this embodiment, PCI link 20c connects MC/HB 16 to a service processor interface 30 to allow communications between I/O device 24a and a service processor 32. Service processor 32 is connected to processors 12a, 12b via a JTAG interface 34, and uses an attention line 36 which interrupts the operation of processors 12a, 12b. Service processor 32 may have its own local memory 38, and is connected to read-only memory (ROM) 40 which stores various program instructions for system startup. Service processor 32 may also have access to a hardware operator panel 42 to provide system status and diagnostic information.

In alternative embodiments computer system 10 may include modifications of these hardware components or their interconnections, or additional components, so the depicted example should not be construed as implying any architectural limitations with respect to the present invention. The invention may further be implemented in an equivalent cloud computing network.

When computer system 10 is initially powered up, service processor 32 uses JTAG interface 34 to interrogate the system (host) processors 12a, 12b and MC/HB 16. After completing the interrogation, service processor 32 acquires an inventory and topology for computer system 10. Service processor 32 then executes various tests such as built-in-self-tests (BISTs), basic assurance tests (BATs), and memory tests on the components of computer system 10. Any error information for failures detected during the testing is reported by service processor 32 to operator panel 42. If a valid configuration of system resources is still possible after taking out any components found to be faulty during the testing then computer system 10 is allowed to proceed. Executable code is loaded into memory 18 and service processor 32 releases host processors 12a, 12b for execution of the program code, e.g., an operating system (OS) which is used to launch applications and in particular the circuit design verification application of the present invention, results of which may be stored in a hard disk drive of the system (an I/O device 24). While host processors 12a, 12b are executing program code, service processor 32 may enter a mode of monitoring and reporting any operating parameters or errors, such as the cooling fan speed and operation, thermal sensors, power supply regulators, and recoverable and non-recoverable errors reported by any of processors 12a, 12b, memory 18, and MC/HB 16. Service processor 32 may take further action based on the type of errors or defined thresholds.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Computer system 10 carries out program instructions for a liveness verification process that uses novel abstraction techniques to identify spurious counterexamples. Accordingly, a program embodying the invention may include conventional aspects of various circuit design and verification tools, and these details will become apparent to those skilled in the art upon reference to this disclosure.

It has been noted in past work ("Liveness Checking as Safety Checking to Find Shortest Counterexamples to Linear Time Properties", Viktor Schuppan et al., PhD Thesis, ETH Zurich 2006) that subsetting a set of shadow registers is a sound yet incomplete abstraction for liveness verification: a proof that no bad loop exists over a subset of state elements implies that no bad loop exists over all state elements. However, a counterexample obtained using a subset may not be valid for the entire design. This is similar to the observation that an exact liveness-to-safety (LTS) conversion followed by localization abstraction which is able to cut-point shadow registers is sound yet incomplete ("Scalable liveness checking via property-preserving transformations," J. Baumgartner and H. Mony, Design Automation and Test in Europe 2009). Also, while liveness-to safety transforms have enabled the use of a large set of safety checking verification algorithms to address liveness problems, this doubling of the number of state elements tends to significantly burden verification algorithms, in many cases resulting in an unsolved property. It would, therefore, be desirable to devise an improved method of liveness verification which could implement a well-tuned native liveness-to-safety abstraction-refinement loop. It would be further advantageous if the method could solve for liveness without being computationally expensive.

Figure 3:
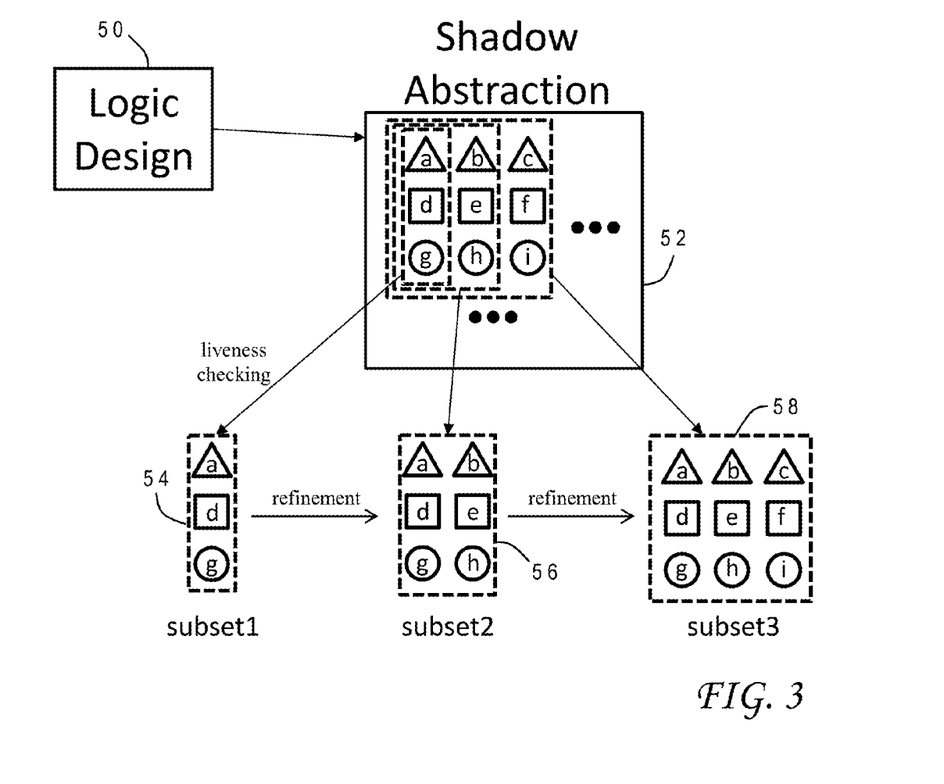
FIG. 3 is a block diagram illustrating how a shadow abstraction is created for liveness checking a logic design and how different subsets of state elements are designated for abstraction refinement in accordance with one implementation of the present invention.

The present invention achieves these objectives by through liveness checking which starts with an initial subset (possibly empty) of state elements to include in the abstraction, and refines the abstraction using different state elements if a counterexample is encountered. An example is provided in FIG. 3, wherein a logic design 50 under test is used to create a shadow abstraction 52 having various state elements a-i representing features of logic design 50, using computer system 10 of FIG. 2. The abstraction is referred to as "shadow" because it represents an additional copy of each register which configurably takes exactly the same input as the register on which the shadow was constructed (i.e., has the same next-state function) or it holds its value. Shadow registers are useful for detecting the state repetition checks/ loops, to see if a previously-sampled and held value in the shadow register matches the current state of the original register being shadowed. The state elements may correspond to a variety of elements in the circuit design including without limitation nodes, singular gates, combinational logic, storage devices such as latches or registers, or other types of circuit elements, according to a netlist or other circuit description for the design received by a program running on computer system 10 which can implement the present invention. Those skilled in the art understand that FIG. 3 is simplified inasmuch as a logic design for a state-of-the-art electronic device such as a microprocessor will have hundreds if not thousands of state elements.

Liveness checking is then carried out using a first subset 54 of the state elements (a, d, g). Liveness specifications can be written in PSL (Property Specification Language) or any temporal specifications. In the illustrative implementation, liveness checking is performed using a liveness-to-safety conversion including only the specified subset of shadow registers, and a conventional verification engine is then used to see if the liveness property is solved. Proofs are valid by construction; counter-examples must be analyzed for validity as follows. If a counterexample is detected, the abstraction is refined by determining a set of state elements not shadowed in the previous step to include in the next verification subset. In FIG. 3, a second subset 56 is created by including new state elements (b, e, h). In this example, the state elements from the original subset (a, d, g) are still included in the next subset, but it is not necessary to include all state elements previously shadowed. Liveness checking is then repeated using this new subset of state elements. The process can be iterative, so if a counterexample is still encountered with the second subset, another subset 58 may be generated by again including a set of state elements not previously shadowed (c, f, i). If no counterexample is found when using a new subset, the previous counterexample was spurious, and liveness is verified. If a counterexample is still encountered after a predetermined number of iterations as desired by the designer, it is considered valid, i.e., the liveness checking fails.

In the preferred implementation, the circuit design is encoded in a machine-readable format as a netlist containing a finite directed graph with vertices representing gates, and edges representing interconnections between those gates. The gates have associated functions, such as constants, primary inputs (hereafter referred to as RANDOM gates), combinational logic such as AND gates, and sequential elements (hereafter referred to as registers). Registers can have two associated components: their next-state functions, and their initial-value functions. Both are represented as other gates in the directed graph. Semantically, for a given register, the value appearing at its initial-value gate at time "0" (initialization or reset time) will be applied as the value of the register itself; the value appearing at its next-state function gate at time "i" will be applied to the register itself at time "i+1". A set of valuations to all registers in a netlist is called a state. Certain gates can be labeled as targets or liveness. Targets correlate to safety properties, where the goal of the verification process is to find a way to drive a "1" to a target, or to prove that no such assertion of the target is possible. A liveness gate correlates to a different type of property for which verification is desired. In particular, the goal is to demonstrate that the liveness gate may be held at "1" effectively forever (and to generate a counterexample trace illustrating this scenario if one is found), or to prove that the liveness gate cannot stay at value "1" forever. In a liveness counterexample, one special gate is depicted which is hereafter referred to as LOOP, which initializes to "0" and at some point in the trace becomes and stays "1". Semantically, the suffix of the trace where LOOP is "1" represents a state repetition sequence which may be infinitely repeated. According to this implementation, the liveness signal must evaluate to "1" throughout that suffix to constitute a valid counterexample. Other gates representing constraints are used to artificially limit the stimulus that can be applied to the RANDOM gates of the design; in particular, when searching for a way to drive a "1" to a target, the verification process must adhere to the rule that every constraint gate must evaluate to a logical "1" for every time-step up to, and including, the time-step at which the target is asserted. For example, a constraint could be added which drives a "1" exactly when a vector of RANDOM gates evaluates to even parity. Without this constraint, the verification tool would consider valuations with even or odd parity to those RANDOM gates; with the constraint, only even parity would be explored.

A known technique for casting liveness properties to safety targets is to duplicate the registers of a netlist. Under the control of a new RANDOM gate, representing the initiation of the LOOP, these duplicated registers sample and hold the current state of the design. The termination of the LOOP can be detected by comparing the sampled state in the duplicated registers against the current state of the netlist. Provided that the liveness gate remained asserted to "1" during the duration of the LOOP (which can be detected by an accumulator which remembers any de-assertion of the liveness gate since its LOOP), this constitutes a valid counterexample to the liveness property. The resulting condition may be implemented solely as a safety target as noted by the Biere et al. paper mentioned above.

Numerous algorithms may be used to attempt to verify the targets of a netlist. Formal verification algorithms (which deal with logical proofs) attempt to exhaustively verify the design against all behaviors, comprising the ability to not only expose design flaws but also to yield proofs of correctness. There are numerous types of formal algorithms, from techniques which exhaustively enumerate the exact set of reachable states of the netlist to overapproximating techniques such as induction. Exact techniques such as reachability analysis are advantageous since they always generate conclusive results, pass or fail; however, they are very computationally expensive hence only applicable to smaller netlists. Overapproximating techniques are much more scalable, though unfortunately may be inconclusive in some cases, generating spurious failures due to the nature of the overapproximation which are not valid with respect to the original design. Semi-formal verification algorithms are scalable techniques which are useful for exposing design flaws, though generally are incapable of yielding proofs of correctness. Semi-formal verification techniques underapproximately explore the behavior of the design, e.g., using random simulation to sample various reachable states of a design, then to perform resource-bounded exhaustive search to explore all states reachable within n time-frames from those simulation states.

Figure 4:
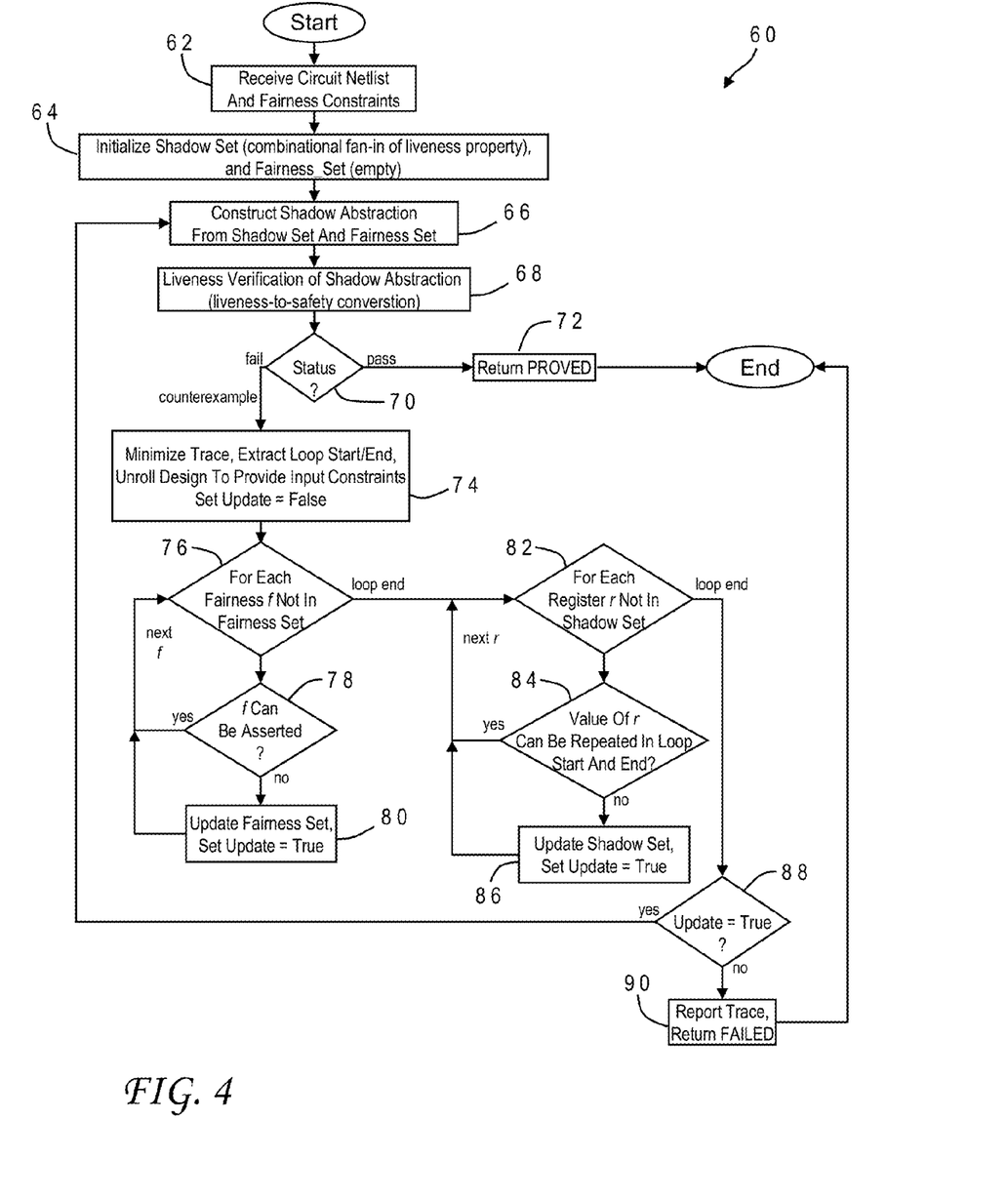
FIG. 4 is a flow chart illustrating the logical flow for an abstraction-refinement framework for liveness-to-safety conversion in accordance with one implementation of the present invention.

With further reference to FIG. 4, there is depicted a high-level chart of the logical flow for a general liveness verification, abstraction-refinement process 60 in accordance with one implementation of the present invention. Process 60 begins when computer system 10 or other data processing system receives the netlist for the proposed circuit design including any fairness constraints (62). The shadow set is then initialized (discussed further below), and the fairness set is set to empty (64). The shadow abstraction is constructed (66), verification is performed, in this implementation, safety-based (68), and the status of the verification is examined (70). If the status of the verification indicates that the shadow set passes, liveness is confirmed and a PROVED signal is returned to the operator indicating success (72), ending the process. If the status of the verification is a fail (a liveness counterexample is found), a trace of the counterexample is generated, the loop start and end points are extracted, the design is unrolled to provide input constraints, and an update flag is set to "False" (74). Unrolling refers to creating n copies of the design representing the behavior of the design over the first n timesteps from the initial state. The first copy embeds initial states in place of registers, and the i+1-th copy embeds next-state function gates from time i in place of the registers at time i+1. A loop then begins for each fairness f which is currently not in the fairness set (76). For any f that cannot be asserted (78), the fairness set is updated to include that fairness, and the update flag is set to "True" (80). Another loop then begins for each register r not in the shadow set, i.e., not in the combinational fan-in of the liveness property (82). For any value of r that cannot be repeated in the loop start and end (84), the shadow set is updated to include that register, and the update flag is set to "True" (86). SAT (satifiability) queries can be formulated on the unrolled design and a check is made to see whether r can be repeated or f is asserted in between loop start and loop end, by checking the appropriate valuations of gates at the appropriate unrolled timesteps. After completing both loops, the update flag is checked (88). If the update flag is set to "True", the process returns iteratively to box 66; otherwise, the trace is reported, and liveness is not found so a FAILED signal is returned to the operator indicating success (88).

The process of FIG. 4 provides a general framework for abstract liveness-to-safety conversion. Instead of shadowing all registers for the loop detection check, only the subset of registers identified in steps 66 and 86 are shadowed, entailing a smaller design for verification in step 68. Smaller designs entail exponential speedups to this verification step. The present disclosure is the first to pursue high-performance methods for leveraging the generic ability to subset shadow registers for sound verification (passing verification results on the abstract netlist are accurate for the original netlist) yet still incomplete (failing verification results may be inaccurate; counterexamples may be invalid). Additional algorithms described below constitute novel methods to enable even higher verification capacity.

A variety of techniques may be used to produce as small as possible abstractions which are immune to already-encountered spurious counterexamples. For example, proof-based abstraction-refinement may be used to analyze bounded model checking (BMC) proofs over the non-abstract problem to determine a boundedly adequate set of shadow registers, i.e. those relevant to refuting a concrete counterexample of a given bound. Counterexample-based abstraction-refinement may be used to determine a set of missing shadow registers which cannot be made equivalent at the start vs. end of the spurious counterexample loop; this type of abstraction is irrelevant to the prefix of the counterexample. However, known techniques for safety property abstraction are not straight-forwardly applicable to this problem, as they are generically attempting to identify abstracted logic which may be the cause of spurious failure. When applied to a precise liveness-to-safety converted netlist (i.e., all registers are shadowed), the loop checking logic often confuses the techniques used by localization into including even irrelevant logic.

Figure 5:
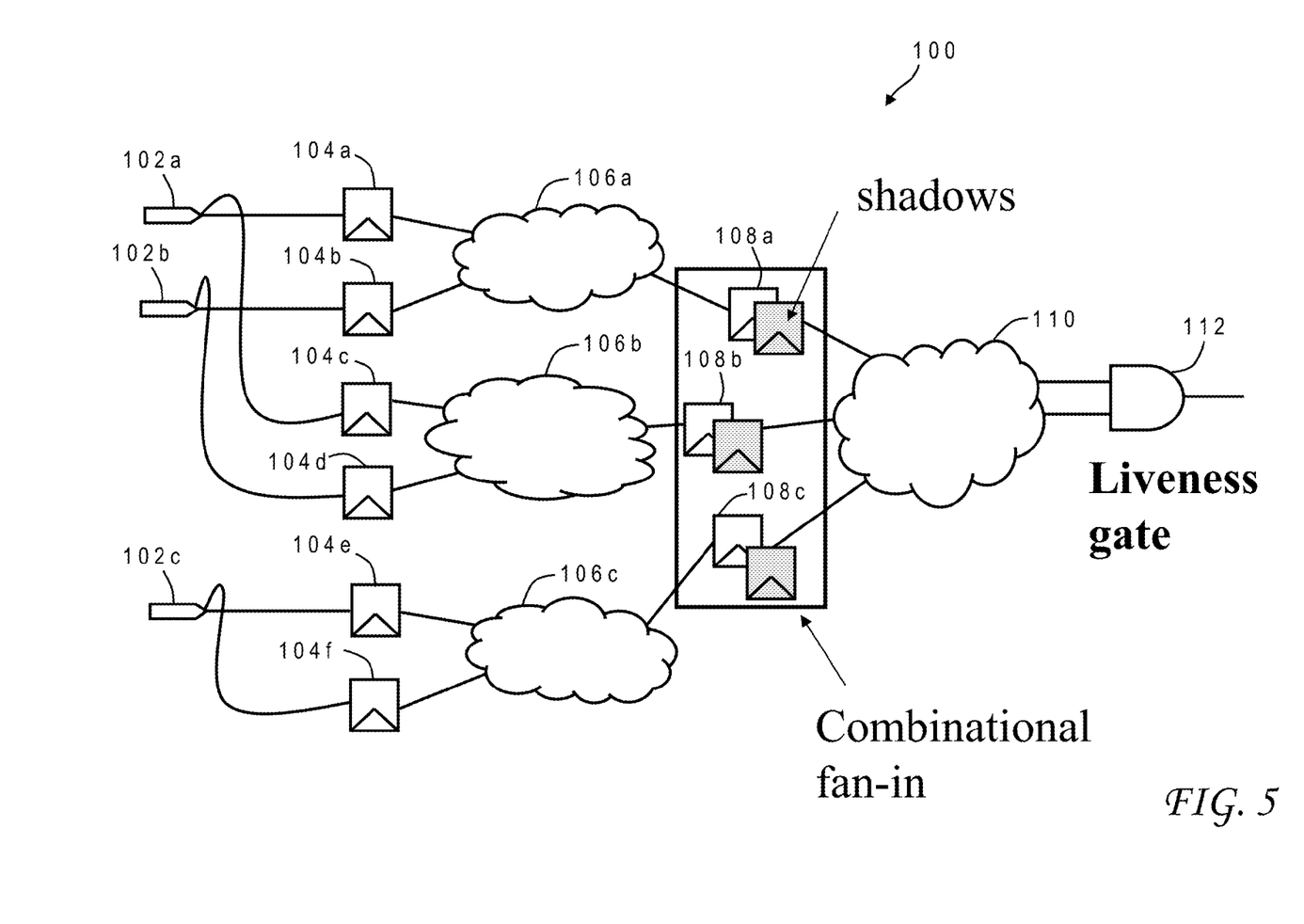
FIG. 5 is a schematic diagram illustrating a portion of a circuit design which includes a combinational fan-in for a liveness gate in the circuit design which is used to construct a shadow set of registers in accordance with one implementation of the present invention.

According to one implementation of the present invention, a simulation-based counterexample-guided abstract liveness checking algorithm can start with the initial subset of state elements by choosing all registers in the combinational fan-in of the liveness property, and an empty fairness set. FIG. 5 illustrates an example of a combinational fan-in for a portion of a circuit 100 in a design under test. Circuit 100 includes a plurality of primary inputs 102a, 102b, 102c which feed values to a plurality of input storage devices (e.g., latches or registers) 104a, 104b, 104c, 104d, 104e, 104f. The values are provided by the storage devices to various combinational logic 106a, 106b, 106c, each of which provides an output that is further connected to an input of another set of storage devices 108a, 108b, 108c. These storage devices 108a, 108b, 108c provide the inputs to a final combinational logic 110 whose outputs drive an output gate 112, in this case, an AND gate. Further to this example AND gate 112 has been designated as a liveness gate for testing the design. Since the storage devices 108a, 108b, 108c are the final stage of storage devices in the fan-in leading to liveness gate 112, they constitute the combinational fan-in for the liveness property, and so those registers are shadowed for the initial subset of state elements.

In experimentation regarding the present invention, this approach was often an effective way to seed the abstraction process without requiring an excessively large shadow subset. These sets can then be used for converting liveness-to-safety in an abstract manner, i.e., constructing shadow equality logic only for registers available in the shadow set, and accumulation logic which remembers any assertion of the fairness in the loop for each fairness in the fairness set. In case the status is passed then the verification can be concluded. Otherwise simulation is repeated on the received trace to fill in values for previously non-abstracted logic, i.e., to obtain concrete values for registers not in the shadow set and fairness gates which are not in the fairness set. Once we have the complete filled trace, those fairness gates which are not hit in the loop can be added to the fairness set, and registers for which values are not repeated between loop start and loop end can be added to the shadow set. If all fairness hits in the loop and repetitions for each register are observed then a valid liveness failure can be reported, otherwise this process is iterated with the refined shadow and fairness sets. This simulation-based algorithm can be represented in pseudo-code as follows:

```
SIM_guided_abstract_Liveness_check (l, F) {
  // l = liveness gate
  // F = set of fairness gates
  shadow_set = collectCombinationalFaninOfLivenessProperty(l);
  if (shadow_set == NULL) { // this is an optional step
    shadow_set = collectCombinationalFaninRegs(F);
  }
  fairness_set = empty;
  Update = TRUE;
  while (Update) {
    // S is safety target
    S = constructAbstractLtsNetlist(shadow_set, fairness_set);
    Update = FALSE;
    status = verifySafety(S, trace);
    if (status == PASS) {
      return proved;
    }
    trace = simulateTraceForFillingNonAbstractedLogic(trace);
    for each fairness f {
      if (f is not in fairness_set) {
        if (not checkFairnessHitInLoop(f, trace)) {
```

```
            Update = TRUE;
            updateFairnessSet(fairness_set, f);
          }
        }
      }
      for each register r {
        if (r is not in shadow_set) {
          if (not checkRepetitionBtLoopStAndLoopEnd(r, trace)) {
            Update = TRUE;
            updateShadowSet(shadow_set, r);
          }
        }
      }
      if (not Update)
        return trace as concrete counterexample;
    }
  }
}
```

In this simulation based approach, data may be included that are actually unnecessary to yield a valid verification result on the abstract netlist. A straight-forward approach to address this issue is via arbitrary subsetting, i.e., just choosing an arbitrary subset of the shadow set and the fairness set. However, arbitrary subsetting is not effective in practice as it entails too many spurious verification results to iterate through. Therefore, an alternative approach based on bounded model checking (BMC) is proposed in the following algorithms. The idea is to cast a BMC check adhering to the defined input values from the abstract counterexample, using the power of symbolic analysis over undefined values (versus arbitrarily-chosen simulation values) to check which subset of fairness events not in the fairness set cannot be asserted in the loop; these are added for the refinement. Otherwise, the algorithms can check which registers not in the shadow set cannot be made to repeat; these are then added for the refinement.

In a further implementation of the present invention using a counterexample-guided BMC-based approach for liveness checking, the pre-processing steps to yield the initial abstraction are similar to the former simulation-based approach. If a spurious liveness failure is received on the abstracted design, then the original design can be unrolled until the time frame at which the state repetition in the abstract trace was observed, extracting input values from the trace over time, and constraining those input values in the unrolled design. For example, if the trace is of length n, the 0/1 values observed at input gate g at each timestep i of the trace become constraints that the corresponding i-th unrolled copy of g takes the observed 0/1 value. Once the unrolled netlist is available satisfiability (SAT) problems can be formulated for each fairness not in the fairness set (i.e., "can we find a fairness hit in any time frame in the loop?") and each register not in the shadow set (i.e., "can we find a repetition between loop start and loop end?"). This is reflected through unrolling the design for as many timesteps as reflected in the counterexample trace, checking for a true liveness failure on the original design, and constraining with any input values on the original trace. If the verification on these problems results as satisfiable then input values to both the trace and the unrolled design are incrementally updated, otherwise these are added into the fairness set and shadow set, respectively. If the abstract counterexample can be iteratively converted to a concrete counterexample, i.e., no register or fairness is added for the refinement, then the algorithm can report as a valid liveness failure, otherwise this process is iterated. In the pseudo-code below "ud" reflects the unfolded design to be used as the basis for SAT solving, and "s_trace" is a trace beginning from the original abstract counterexample trace, that is iteratively added to during the refinement process.

```
BMC_counterexample_guided_abstract_Liveness_check (l, F) {
  // l = liveness gate
  // F = set of fairness gates
  shadow_set = collectCombinationalFaninOfLivenessProperty(l);
  if (shadow_set == NULL) { // This is an optional step
    shadow_set = collectCombinationalFaninRegs(F);
  }
  fairness_set = empty;
  Update = TRUE; trace = {empty};
  while (Update) {
    // S is safety target
    S = constructAbstractLtsNetlist(shadow_set, fairness_set);
    Update = FALSE;
    status = verifySafety(S, trace);
    if (status == PASS) {
      return proved;
    } // else "trace" is a counterexample
    minimize_trace(trace); // to reduce the number of assigned inputs in "trace"
    s_trace = trace;
    ud = unrollTheDesign(original_netlist, depth=loop_end);
    constrainInputs(s_trace, ud);
    for each fairness f {
      if (f is not in fairness_set) {
        sat_target = createFairnessAssert(f, ud, loop_start, loop_end);
        s_status = check_satisfiability(sat_target, s_trace);
        if (s_status == UNSATISFIABLE) {
          Update = TRUE;
          updateFairnessSet(fairness_set, f);
        }
        else { // The SAT query is satisfiable
          constrainInputs(s_trace, ud);
          updateTrace(s_trace, trace);
        }
      }
    }
    for each register r {
```

```
            if (r is not in shadow_set) {
                sat_target = createEquality(r, ud, loop_start, loop_end);
                s_status = check_satisfiability(sat_target, s_trace);
                if (s_status == UNSATISFIABLE) {
                    Update = TRUE;
                    updateShadowSet(shadow_set, r);
                }
                else { // The SAT query is unsatisfiable
                    constrainInputs(s_trace, ud);
                    updateTrace(s_trace, trace);
                }
            }
        }
        if (not Update) {
            return concrete counterexample;
        }
    }
}
```

Another implementation of the present invention using a proof-based BMC approach to construct an abstract counterexample begins with an abstract netlist similar to the BMC-based approach just described. If a proof is not obtained on this abstract counterexample, this approach can perform bounded model checking on the original design versus the abstract design. Instead of iteratively adding to s_trace as in the counterexample-guided BMC-based approach, it analyzes the proof returned if there is no counterexample obtained on the original unfolded design to determine what logic must be refined. The satisfiability check can result in whether the sat_target is satisfiable or unsatisfiable. The unsatisfiable results correspond to proofs. The "AnalyzeProofForRegTargetsThatCouldNotBeSatisfied" function can identify the registers (reg_targets) which cannot have their valuations repeated at loop start and loop end. Similarly, the "AnalyzeProofForRegTargetsThatCouldNotBeSatisified" function can identify the fairness (fair_target), which can't be asserted in loop. The pseudo-code for this proof-based BMC abstraction refinement follows:

```
Proof_guided_abstract_Liveness_check (l, F) {
    // l = liveness gate
    // F = set of fairness gates
    shadow_set = collectCombinationalFaninOfLivenessProperty(l);
    if (shadow_set == NULL) {
        shadow_set = collectCombinationalFaninRegs(F);
    }
    fairness_set = empty;
    while (true) {
        // S is safety target
        S = constructAbstractLtsNetlist(shadow_set, fairness_set);
        status = verifySafety(S, trace);
        if (status == PASS) {
            return proved;
        }
        ud = unrollTheDesign(original_netlist, depth=loop_end);
        constrainInputs(trace, ud);
        sat_target = LOGIC_1;
        for each fairness f {
            if (f is not in fairness_set) {
                fair_target = createFairnessAssert(f, ud, loop_start, loop_end);
                sat_target = (sat_target AND fair_target);
            }
        }
        for each register r {
            if (r is not in shadow_set) {
                reg_target = createEquality(r, ud, loop_start, loop_end);
                sat_target = (sat_target AND reg_target);
            }
        }
        // Now try to satisfy the sat_target
        proof = {empty}
        s_status = check_satisfiability(sat_target, proof);
        If (s_status == SATISFIABLE) {
            return concrete counterexample;
        }
        else {
            R1 = AnalyzeProofForRegTargetsThatCouldNotBeSatisfied(proof);
            F1 = AnalyzeProofForFairTargetsThatCouldNotBeSatisfied(proof);
            // R1 and F1 and sets of registers and fairness gates respectively
            shadow_set = shadow_set Union R1;
            fairness_set = fairness_set Union F1;
        }
    }
}
```

In a further alternative implementation, abstraction refinement can be based on bounded model checking with a precise liveness-to-safety (LTS) netlist. In such a framework, the precise LTS netlist is unrolled for a specific number of time steps and a satisfiability check is performed. If the SAT verification results as unsatisfiable (UNSAT) then extract the UNSAT core is extracted and an abstract LTS netlist is converted based on this UNSAT core. Given an unsatisfiable Boolean propositional formula (in conjunctive normal form) an UNSAT core corresponds to a subset of clauses/constraints whose conjunction is still unsatisfiable. In a verification setting, typically unsatisfiability corresponds to proofs or bounded proofs and satisfiability corresponds to failures. Once we have the abstract LTS, unbounded safety verification can be performed. If the verification results as PASS then the verification status is returned as proved. Otherwise, this process is repeated by setting the next unroll depth to the length of spurious counterexample returned by the abstract LTS. The LTS netlist approach is embodied in the following pseudo-code:

```
bounded_abstract_Liveness_check (l, F) {
  // l = liveness gate
  // F = set of fairness gates
  S = constructPreciseLTS(l, F);
  Update = TRUE;
  i = 1;
  while (Update) {
    ud = unrollTheDesign(S, depth=i);
    proof = {empty};
    status = check_satisfiability(ud, proof);
    Update = FALSE;
    if (status == UNSATISFIABLE) {
      r1 = ExtractSetofImportantRegistersFromProof(proof);// identify those registers which are
                                                    present along with their shadows in the UNSAT core
      f1 = ExtractSetOfImportantFairnessGatesFromProof(proof); //Identify the fairness gates that are
                                                    present in the UNSAT core
      S1 = constructAbstractLtsNetlist(r1, f1);
      a_trace = {empty};
      a_status = verifyUnboundedSafety(S1, a_trace);
      if (a_status == PASS) {
        return proved;
      } else {
        Update = TRUE;
        i = trace_length(a_trace);
      }
    } else {
      // The bounded satisfiability check was satisfiable
      return concrete counterexample;
    }
  }
}
```

Hybrid approaches may also be taken for abstraction-refinement liveness-to-safety conversion. One hybrid implementation between counterexample-based and proof-based abstraction-refinement liveness-to-safety conversion starts with an abstract LTS netlist and performs bounded model checking on this netlist. If the BMC results as UNSAT then the algorithm extracts the UNSAT core and further abstracts the previously abstracted LTS netlist, and then performs unbounded safety verification. Otherwise, it performs counterexample-based abstraction described in either of the two foregoing algorithms. If the unbounded verification on the further abstracted LTS netlist concludes as PASS then the verification can be halted by reporting the status as proved. Otherwise, the further abstracted LTS netlist can be unrolled to the length of spurious counterexample returned by the unbounded safety, and this process is iterated until a true liveness counterexample or a valid proof is found. The following pseudo-code represents this particular hybrid approach:

```
Hybrid_abstract_Liveness_check (l, F) {
  // l = liveness gate
  // F = set of fairness gates
  shadow_set = collectCombinationalFaninOfLivenessProperty(l);
  if (shadow_set == NULL) {
    shadow_set = collectCombinationalFaninRegs(F);
  }
  fairness_set = empty;
  Update = TRUE;
  i = 1;
  while (Update) {
    // S is safety target
    S = constructAbstractLtsNetlist(shadow_set, fairness_set);
    while (true) {
      ud = unrollTheDesign(S, depth=i);
      proof = {empty};
      status = check_satisfiability(ud, proof);
      Update = FALSE;
      if (status == UNSATISFIABLE) {
        r1 = ExtractSetofImportantRegistersFromProof(proof); // Identify those registers which are
                                                       present along with their shadows in the UNSAT core
        f1 = ExtractSetofImportantFairnessGatesFromProof(proof); //Identify fairness gates that are
                                                       present in the UNSAT core
        ABS_S = constructAbstractLtsNetlist(r1, f1); // Create a new abstract LTS netlist by
                                                       shadowing only r1 and only including set f1. Note that r1
                                                       is a subset of shadow_set and f1 is a subset of fairness set
        a_trace = {empty};
        a_status = verifyUnboundedSafety(ABS_S, a_trace);
        if (a_status == PASS) {
          // We have completed the proof on the ABS_S netlist
          return proved;
        }
        else {
```

```
            // We found a CEX on the ABS_S netlist
            i = trace_length(a_trace); // we set the unfolding depth of the S netlist to be the length of
                            the counterexample from analysis of ABS_S netlist
         }
      } else {
         // The bounded check was satisfiable
         If(counterexample trace valid on original netlist) {
            return counterexample;
         } else {
            S =NewAbstractLtsNetlist_based_on_BMC_based_Proof_refining(proof);
            Update=TRUE;
         }
      } // Bounded check was satisfiable
   } // while (true)
 } // while (update)
}
```

According to yet another implementation, abstraction refinement is based upon bounded liveness checking but instead of looking for a state repetition to constitute a true liveness counterexample, one can check whether the liveness gate may remain asserted for a specific time-bound after all fairness gates have been asserted. This check is accomplished by adding logic that counts the number of consecutive liveness target hits and comparing it to the given bound. This check is again a sound yet incomplete verification method. It is known that for finite netlists, if the original liveness property will pass, there exists a bound for which such a bounded check will pass. However, if bounded liveness checking fails, this may not imply a failure of the original liveness property since the bound may merely be too small and the check may pass for a larger bound. Bounded liveness occasionally out-performs the prior algorithms in speed and abstraction size, since it does not entail the overhead of the shadow logic whatsoever.

Further to this implementation, the bounded liveness netlist is unrolled for a specific number of time steps and a satisfiability check (BMC) is performed. If the SAT verification result is unsatisfiable then, similar to the bounded proof based abstraction refinement, the UNSAT core is extracted and unbounded safety verification is performed on an abstracted LTS netlist constructed using the UNSAT core. If the verification results in a PASS, then the verification status is returned as proved. Otherwise, a check is first made for loop convergence, i.e., whether the abstract counterexample can be converted into a concrete counterexample using methods described above for counterexample-based and proof-based BMC abstraction refinement. If the abstract counterexample cannot be concretized, this process is repeated by setting the next unroll depth to the length of the spurious counterexample returned by the abstract LTS. If the BMC on the bounded liveness netlist results in a counterexample, then the state repetition check is performed on the received trace. If a true loop condition is found, then a concrete counterexample is reported and the verification is halted. Otherwise, the depth of the bounded liveness check is incremented and the entire process repeated. This bounded, liveness-based abstraction refinement is seen in the following pseudo-code:

```
bounded_liveness_basis_abstract_Liveness_check (l, F, bound) {
   Update = TRUE;
   i = 1;
   k = bound;
   while (Update) {
      S = constructBoundedLivenessNetlist(l, F, k);
      while (true) { // Bounded model checking
         ud = unrollTheDesign(S, depth=i);
         proof = {empty};
         status = check_satisfiability(ud, proof);
         Update = FALSE;
         if (status == UNSATISFIABLE) {
            // identify those registers (not involved in counter logic) which are present in UNSAT core
            r1 = ExtractSetofImportantRegistersFromProof(proof);
            // identify the fairness gates that are present in the UNSAT core
            f1 = ExtractSetOfImportantFairnessGatesFromProof(proof);
            S1 = constructAbstractLtsNetlist(r1, f1);
            a_trace = {empty};
            a_status = verifyUnboundedSafety( S1, a_trace);
            if (a_status == PASS) {
               return proved;
            } else {
               l_status = performLoopConvergenceCheck(a_trace);
               if (l_status == PASS) {
                  report concrete counterexample;
                  return FAIL;
               } else {
                  i = trace_length(a_trace);
               }
            }
         } else {// status!= UNSATISFIABLE
            break; // breaking inner while loop due to bounded liveness hit
```

```
    }
  } // inner while loop
  b_status = performStateRepetetionCheckOnBoundedHit(bounded_hit_trace);
  if (b_status == LOOP_FOUND) {
    report concrete counterexample;
    return FAIL;
  } else {
    k = k + 1; // increase the bound for bounded liveness check
    Update = TRUE;
  }
 } // while (Update)
} // bounded_liveness_basis_abstract_Liveness_check
```

It is possible to combine any of the foregoing approaches to abstraction refinement in a single process. The present invention accordingly provides high-performance algorithms for abstract liveness-to-safety conversion based upon a variety of refinement techniques including: simulation and counterexample refinement; bounded model checking and counterexample refinement; bounded model checking and proof-based refinement; proofs obtained during bounded model checking of a precise liveness checking problem; a hybrid of counterexample-based refinement and proof analysis; and proofs obtained. These novel techniques are tailored to abstracting the liveness-to-safety conversion process itself, enabling greater verification scalability for arbitrary subsequent verification flows including, for example, the localization technique presented in U.S. Pat. No. 8,527,922.

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. It is therefore contemplated that such modifications can be made without departing from the spirit or scope of the present invention as defined in the appended claims.

What is claimed is:

1. A method of verifying liveness of a logic design comprising:
   receiving a circuit description for the logic design which includes vertices representing gates and edges representing interconnections between the gates, wherein portions of the gates represent different state elements which are evaluated to determine a state of the logic design, by executing first instructions in a computer system;
   designating an initial subset of the state elements for inclusion in an abstraction of the logic design, by executing second instructions in the computer system;
   performing liveness verification on the abstraction based on the initial subset of the state elements, by executing third instructions in the computer system;
   detecting a liveness counterexample in response to said performing the liveness verification, by executing fourth instructions in the computer system; and
   refining the abstraction by designating a second subset of the state elements different from the initial subset for inclusion in a refined abstraction, by executing fifth instructions in the computer system.

2. The method of claim 1 wherein the circuit description includes at least one liveness property of the logic design, and the initial subset of the state elements is designated by choosing all registers in a combinational fan-in of the liveness property.

3. The method of claim 2 wherein the second subset of the state elements is designated by adding at least one selected register not in the combinational fan-in having a value which cannot be repeated in a state loop of the logic design between a start and an end of the loop.

4. The method of claim 3 wherein the second subset of the state elements includes all state elements in the initial subset.

5. The method of claim 1 further comprising subsequently performing a liveness verification on the refined abstraction, again detecting a liveness counterexample in response to the subsequent performing, and further refining the abstraction designating a subsequent subset of state elements different from previous subsets for inclusion in a further refined abstraction, wherein said subsequently performing, again detecting, and further refining are repeated iteratively.

6. The method of claim 1 wherein the liveness verification includes liveness-to-safety conversion on the initial subset of the state elements.

7. The method of claim 1 wherein the circuit description includes at least one fairness property of the logic design, and said refining includes applying the fairness property to the second subset of the state elements.

* * * * *